Feb. 11, 1964 S. KUCHINSKY ETAL 3,121,219

SIGNAL CONVERTERS

Original Filed March 13, 1958

INVENTOR
SAUL KUCHINSKY
RUDOLPH A. COLA
SAMUEL R. SHAW
BY Robert A. Green
ATTORNEY United States Patent Office 3,121,219
Patented Feb. 11, 1964

3,121,219
SIGNAL CONVERTERS

Saul Kuchinsky, Somerville, N.J., and Rudolph A. Cola and Samuel R. Shaw, Philadelphia, Pa., assignors to Burroughs Corporation, Detroit, Mich., a corporation of Michigan Continuation of application Ser. No. 721,228, Mar. 13, 1958. This application Dec. 15, 1961, Ser. No. 160,970
16 Claims. (Cl. 340—347)

Figure 1:
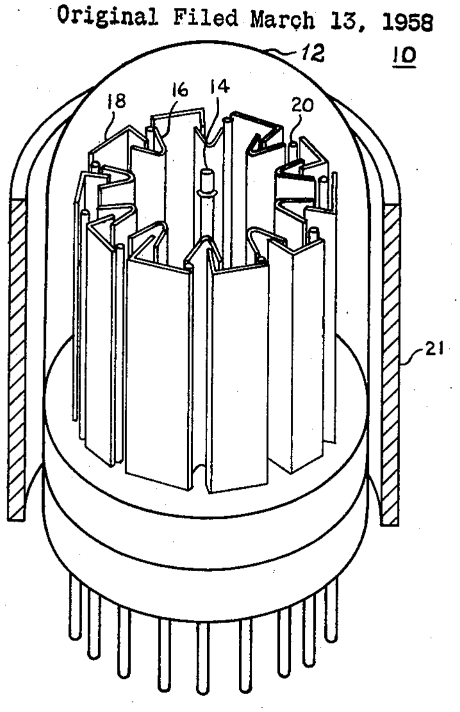

This invention relates to improved electronic circuits for converting electrical signals in one code system to another code system and particularly for decoding and translating binary-coded signals into other code systems.

This is a continuation of application Serial No. 721,228, filed March 13, 1958.

For purposes of economy and simplicity, it is customary to employ a binary system of operation for electronic counters or computers. The output of such a system is, of course, in the binary code, and it is desirable to be able to convert this type of output to a more readily useful system, for example, the octal or decimal system. Electronic systems are known for converting binary-coded signals to the decimal system or to some other system. However, such electronic systems generally employ a diode matrix or other multi-element matrix, an arrangement which is undesirable because of its complexity and costliness. Other decoding systems employ mechanical apparatus which include switches, relays, and the like, and are generally undesirable because of their comparatively low speed of operation. Probably the most important shortcoming of prior art conversion systems is that they cannot readily store a signal which results from the conversion operation.

Accordingly, one object of the invention is to provide an improved electronic circuit for translating electrical signals from one code system to another code system.

Another object of the invention is to provide an electronic circuit for converting signals in the binary system to the decimal system and to other systems.

Still another object of the invention is to provide an improved electronic signal conversion circuit which is capable of storing signals which result from the conversion operation, the circuit being comparatively simple, reliable, and inexpensive.

The present invention is particularly suited for translating binary-coded signals to other code systems and, in brief, comprises a circuit which employs a multi-position electron beam device in which an electron beam may be formed and switched from position to position, from each of which an output signal may be derived. In general, the number of positions employed, at which an electron beam may be formed, determines the system into which the binary-coded signal is converted. For example, if the conversion is to a decimal system, ten positions are employed and if the conversion is to an octal system, eight positions are employed. A plurality of signal input means, each adapted to carry one element or "bit" of a binary-coded signal or number, are coupled to the multi-position electron beam and are adapted to apply the bits thereto. The bits are adapted to be combined in any desired way so that, for any selected combination thereof, current flow is directed to only one of the current-receiving positions where it may be stored. This one current-receiving position provides an output signal which represents the desired decimal or other equivalent of the selected combination of binary elements or bits which represent a binary number. Specifically, the combination of bits of the binary number serves to switch the electron beam current in the current flow device from a zero position through successive positions, determined by the combination, to the selected position, the output signal from which represents the decimal or other equivalent number of the binary number.

The current flow which results from the conversion operation of the beam device may be maintained or stored for as long as desired in the selected position of the multi-position device and may ultimately be employed in many different types of utilization devices and circuits. For example, the various positions in the beam device may be coupled to a visual indicating tube or the like so that the decimal number or other equivalent of the binary-coded signal may be read directly.

Figure 2:
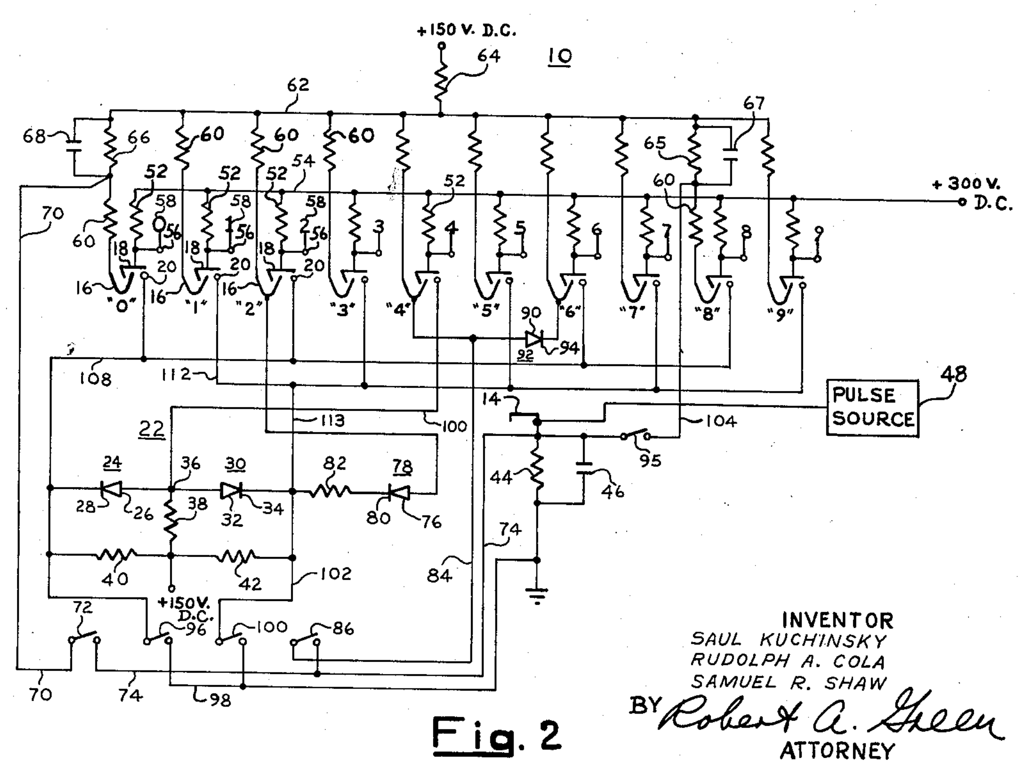

The invention is described in greater detail by reference to the drawings wherein:

FIG. 1 is a perspective view of one type of electron discharge device useful in practicing the invention; and FIG. 2 is a schematic representation of the device of FIG. 1 and a circuit in which it may be used in practicing the invention.

The circuits described below are particularly suitable for use with a multi-position electron beam tube of the type shown in U.S. Patent No. 2,721,955 to Fan et al. This type of tube is shown in FIG. 1 as tube 10 and includes, briefly, an envelope 12 which contains a central longitudinally elongated cathode 14 and ten groups of electrodes spaced radially equidistantly from the cathode and surrounding the cathode. Each group of electrodes includes a generally U-shaped elongated spade electrode 16 and a target electrode 18 positioned so that each target occupies the space between adjacent spade electrodes. Each spade electrode serves to form and hold an electron beam on its corresponding target electrode. A generally rod-like switching electrode 20 is also included in each group of electrodes and is positioned between one edge of each target electrode and the adjacent spade electrode. The switching electrodes are known as switching grids. An open-ended cylindrical permanent magnet 21 is provided surrounding the tube envelope and coaxial therewith. The magnet provides an axial magnetic field which is utilized in conjunction with electric fields within the tube to form and switch an electron beam from the cathode to each of the groups of electrodes. The direction in which the beam switches is always the same and is determined by the orientation of the electric and magnetic fields.

Briefly, in operation of tube 10, electrons emitted by the cathode are retained at the cathode if each of the spades, targets and switching grids carries its normal operating electrical potential. When a spade or switching grid experiences a suitable lowering of its potential, an electron beam is formed and directed to the corresponding target electrode. The electron beam may be switched from one target electrode to the next by thus suitably altering the electrical potentials of a spade or switching grid. Under normal operating conditions, whenever electrode voltages are such that a beam might be supported at several positions, the beam will switch to the most leading position and lock in at this position.

In the circuit of FIG. 2, the tube 10 is arranged to convert a 1–2–4–8 binary number or signal to a number in the decimal system. The circuit of FIG. 2 includes an OR or signal mixing gate 22 which comprises a diode 24 having an anode 26 and a cathode 28 and a diode 30 having an anode 23 and a cathode 34. The anodes of the diodes 24 and 30 are connected together, with the junction point 36 between them being connected through a suitable resistor 38 to a positive supply voltage of about 150 volts. The supply voltage is also connected through a resistor 40 to the cathode 28 of the diode 24 and through another resistor 42 to the cathode 34 of the diode 30.

In FIG. 2, the tube 10 is shown schematically in linear form and the groups of electrodes of the tube, numbered "0" to "9" as shown, represent positions at which an electron beam may be formed and from which an output signal may be obtained. In the circuit of FIG. 2, the cathode 14 is connected to ground through a suitable resistor 44 bypassed by a capacitor 46. The cathode is also connected to a source 48 of positive "clear" pulses of about 150 to 200 volts which are used to drive the cathode to a positive potential and thus clear an electron beam from any one of the tube positions at which it might be formed.

The target electrodes 18 are connected in the circuit as follows. The target electrodes are connected through suitable load resistors 52 to a common target bus 54 which is coupled to a positive voltage supply of about 300 volts. The targets 18 may be connected to any suitable utilization device. For example, each target may have an output terminal 56 which is connected to one of the indicator cathode elements 58 of an indicator glow tube such as the type 6844 gaseous indicator tube. In such an arrangement, the target at the "0" position is connected to the cathode numeral zero; the target at the "1" position is connected to the cathode numeral one, and so forth, as shown. To simplify the drawing, the other electrodes of such an indicator tube are not shown.

The spade electrodes 16 are connected in the circuit as follows. All of the spade electrodes are coupled through spade load resistor 60 to a spade bus 62 which is coupled through a common spade resistor 64 to the positive 150 volt supply. A resistor 66 and a capacitor 68 in parallel are provided between the "0" spade resistor and the spade bus. A similar parallel circuit including a resistor 65 and capacitor 67 is connected between the spade load resistor of the "8" position spade and the spade bus 62. Both parallel circuits are used in clearing and resetting a beam in the tube.

In addition, selected ones of the spade electrodes are connected as follows. The point at which the "0" spade resistor 62 is connected to the parallel combination of resistor 66 and capacitor 68 is coupled through lead 70 to a switch 72 and from switch 72 through a lead 74 to the cathode 14 of the tube 10. The "2" space is connected to the anode 76 of a diode 78, the cathode 80 of which is connected through a resistor 82 to the cathode 34 of the diode 30. The "4" spade is coupled by a lead 84 to a switch 86 and from switch 86 through a lead 88 to the cathode 14. The "4" spade is also connected to the anode 90 of a diode 82, the cathode 94 of which is connected to "6" spade. The junction point of the "8" spade resistor and the parallel combination of resistor 65 and capacitor 67 is connected through a switch 95 to the cathode 14.

Referring to the OR gate 22, the cathode 28 of the diode 24 is coupled to a switch 96 and from the switch 96 by a lead 98 both to ground and through a switch 100 and a lead 102 to the cathode 34 of the diode 30.

The switching grids 20 are connected in the circuit as follows. Each of the even-numbered switching grids, except the switching grid at the "4" position, is connected to a common lead 108 which is coupled in turn to the cathode 28 of the diode 24. The switching grid at the "4" position is coupled by a lead 110 to the junction point 36 of the anodes of the diodes 24 and 30. The odd-numbered switching grids are connected to a common lead 112 which is connected in turn by a lead 113 to the cathode 34 of the diode 30.

The switches 72, 96, 100, 86, and 95 are connected to perform the following operations. The switch 72 is employed in a zero-set circuit which operates in conjunction with the clear pulse source 48 to clear an electron beam from a position in the tube and to reset it at the "0" position. The switch 96 is in a circuit which transmits the 1-bit or element of the binary number to the tube 10; the switch 100 is in a circuit which transmits the 2-bit of the binary number to the tube 10; the switch 86 is in a circuit which transmits the 4-bit of the binary number to the tube 10; and the switch 95 is in a circuit which transmits the 8-bit of the binary number to the tube 10.

To clarify the above-mentioned circuits, they are described separately as follows. The zero-set circuit extends from the 150 volt supply through the common spade resistor 64, through the spade bus 62, resistor 66 and lead 70 through the switch 72, and through the lead 74 to the cathode and then to ground. The 1-bit circuit extends from ground through the lead 98 and the switch 96, through the diode 24 of the OR gate 22, and through the resistor 38 to the 150 volt power supply. The 2-bit circuit extends from ground through the lead 98 and the switch 100 and lead 102 through the diode 30 and the resistor 38 of the OR gate to the 150 volt power supply. The 4-bit circuit extends from ground through the cathode resistor 44 through the lead 74 and switch 86 and lead 84 to the "4" spade and thus to the 150 volt power supply. The 8-bit circuit extends from ground through the cathode resistor 44 through switch 95 and through resistors 65 and 64 to the 150 volt power supply.

In operation of the circuit of FIG. 2, before binary bits are applied to the tube to effect a translating operation, a clear pulse is applied to the cathode 14 from the source 48 to clear the tube, and then zero-set switch 72 is closed so that the "0" spade is connected to ground. Since the "0" spade is thus at a lower potential than the other spades, an electron beam forms at the "0" position. The presence of an electron beam at the "0" position energizes the numeral zero in the indicator tube. Thus, with no binary bits applied to the tube, and with the switches 96, 100, 86, and 95 open, a decimal zero reading is obtained. In order to obtain a decimal "1" count, the switch 96 is closed. This operation connects the even-numbered switching grids 20 to ground and the electron beam switches from the "0" position to the "1" position and the numeral "1" is energized in the indicator tube. A decimal "2" count is obtained by closing switch 100. This connects the "2" spade to ground through the resistor 82 and diode 78, and, at the same time, the odd-numbered switching grids and the "4" position switching grid are also connected to ground through the lead. The connection of the "2" spade to ground switches an electron beam from the "0" spade to the "2" spade. However, the connection of the odd-numbered grids and the "4" position grid to ground has no effect on the beam. Thus, the beam remains in the "2" position and the numeral "2" is energized in the indicator tube.

The decimal "3" count is obtained by closing switch 100, opening switch 100, and then closing switch 96. As described above, closing switch 100 forms an electron beam at the "2" position, and, since switch 96 connects the even-numbered switching electrodes to ground, the electron beam is switched from the "2" position to the "3" position. A decimal "4" count is obtained by closing the switch 86 and connecting the "4" spade to cathode. This connection causes an electron beam to switch to the "4" position. A decimal "5" representation is obtained by closing switch 86, opening switch 86, and then closing switch 96. This operation forms a beam in the "4" position, and then the grounded even-numbered switching electrodes switch the beam one more position to the "5" position.

A decimal "6" representation is obtained by closing switch 86, opening switch 86, and then closing switch 100. Switch 86 causes a beam to form in the "4" position, and switch 100 connects the odd-numbered grids to ground. Since the grid at the "4" position is connected to the odd-numbered grids through the OR gate, this "4" grid is also connected to ground. Thus, the beam is switched by one position to the "5" position. The grounded odd-numbered grids then switch the beam again by one position to the "6" position. The diode 92 holds the "4" position spade at the same potential as the "6" position spade when an electron beam is switched to the "6" position. This locks the beam in securely at the "6" position and prevents any tendency of the beam to switch ahead to the "2" position when the "2" spade is grounded by switch 100.

A decimal "7" count is obtained by closing switch 86, opening switch 86, closing and opening switch 100 and closing switch 96. As described above, the closing and opening in turn of switches 86 and 100 causes a beam to form in the "6" position, and, since switch 96 controls the operation of the even-numbered grids, the beam is switched one more position to the "7" position. A decimal "8" count is obtained by first clearing the tube with a clear pulse from the source 48 and then without zero-setting, by closing switch 95 and connecting the "8" spade to cathode, whereby an electron beam forms in the "8" position. It is necessary to clear the tube and then not zero-set because a beam would not switch from "0" to "8" since "8" is not a leading position with respect to "0." A decimal "9" count is obtained by forming the beam at the "8" position as described above and, in addition, closing switch 96 which connects the even-numbered grids to ground and thus causes the beam to switch by one position to the "9" position.

The foregoing description of the invention relates to the conversion from the binary to decimal system. The principles of the invention may also be employed to convert from the binary to the octal system. In practicing such a conversion, the switch 95 and all of the circuitry associated with positions "8" and "9" are omitted. In this case, only eight positions, that is positions "0" to "7" in the tube 10, are employed.

In operation of the circuit of FIG. 2, the switches 72, 96, 100, 86, and 95 are operated separately and serially beginning with 72, the zero-set, and then with the other switches being operated in order so that the binary bits are applied in 8–4–2–1 order, with each switch being closed and then opened before the next one is operated. It is clear that suitable negative pulses may be used in place of the various switches. In addition, the various elements or bits of the binary number may be applied, either by a manually operated system or by an automatic system.

The invention thus described provides a new and novel circuit for translating signals from one code system to another in simple fashion with the circuit being capable of storing the translated signal and utilizing the translated signal in different output circuits.

What is claimed is:

1. A circuit for converting an electrical signal from one code system to another code system including an electron discharge device,
  a plurality of groups of electrodes in said device, each of which is adapted to receive an electron beam and provide an output signal therefrom,
  a plurality of signal input means coupled to said device, each providing a separate signal bit,
  each signal input means being coupled to a specific group of electrodes to which it is adapted to apply its signal bit,
  said signal input means being operable to apply said bits in different combinations to said device,
  each combination of signal bits having a meaning in a first code system and when applied to said device, each combination of signal bits causing an electron beam to form at a zero position and then switch to a single specific group of electrodes from which an output signal then flows,
  said output signal from said specific group of electrodes having a meaning in a second code corresponding to the meaning of the input signal bits in the first code.

2. The circuit defined in claim 1 wherein in said device each group of electrodes includes means for storing the output signal at each position in said device.

3. The circuit defined in claim 1 wherein each group of electrodes includes switching means for switching an electron beam from one group of electrodes to another and each of said signal input means is coupled to one of said switching means.

4. The circuit defined in claim 1 wherein said electron discharge device comprises a magnetron beam switching tube in which each group of electrodes includes a target electrode which receives an electron beam and provides an output signal therefrom, a spade electrode which forms an electron beam and holds it on its associated target electrode, and a switching electrode for switching an electron beam from one group of electrodes to another.

5. A signal conversion circuit including a multi-position electron beam device,
  a plurality of electron beam controlling electrodes at each position in said device,
  signal input means coupled to electrodes at different positions in said device and adapted to form an electron beam and position said beam at a single position determined by the signal elements in an input signal thereto, the elements in said input signal being adapted to be grouped in a plurality of different ways with each grouping having its own representation in a first code,
  output means at each position in said device for providing an output signal therefrom,
  each output signal corresponding to one particular group of input signal elements and each having a representation in a second code.

6. The circuit defined in claim 5 and including means for applying said input signal elements serially to said groups of electrodes whereby an electron beam is formed in an arbitrarily designated first position in said device and is switched rapidly to a final position determined by the particular group of input signal elements.

7. A binary decoder including an electron beam switching tube comprising an evacuated envelope containing a central cathode and a plurality of groups of electrodes surrounding said cathode;
  each of said groups of electrodes comprising a position to which an electron beam may flow;
  each group of electrodes including a target electrode which receives an electron beam and produces a corresponding output signal, a spade electrode adapted to form and hold an electron beam on the target electrode, and a switching electrode for switching an electron beam from one group of electrodes to another;
  means providing crossed electric and magnetic fields in said tube whereby an electron beam is adapted to be switched from one group of electrodes to the next in one direction;
  a plurality of signal input sources coupled to selected groups of electrodes at different positions in said tube, the signals from said sources being adapted to be arranged in different combinations each having a meaning in a first code;
  gating means coupled to said sources for applying signals therefrom in different combinations to the corresponding groups of electrodes to which they are coupled,
  said selected signals being adapted to cause an electron beam in said tube to switch in said one direction from an initial position to a single position determined by the combination of said selected signals,
  there being a single position to which an electron beam is switched for each combination of said signals,
  the current flow from each single position having a representation in another code corresponding to the representation in the first code of the combination of signal elements which caused the electron beam to switch to the single position.

8. The circuit defined in claim 7 wherein said signals are adapted to be applied consecutively to the electrodes to which the signal sources are coupled.

9. A signal converter circuit including an electron beam switching tube comprising an evacuated envelope containing a central cathode and a plurality of groups of electrodes surrounding said cathode;

each of said groups of electrodes comprising a position to which an electron beam may flow;

each group of electrodes including a target electrode which receives an electron beam and produces a corresponding output signal, a spade electrode adapted to form and hold an electron beam on the target electrode, and a switching electrode for switching an electron beam from one group of electrodes to another;

means providing crossed electric and magnetic fields in said tube whereby an electron beam is adapted to be switched from one group of electrodes to the next in one direction;

signal input coupling means connected to selected groups of electrodes at different positions in said tube and adapted to apply signals from separate signal sources in different combinations to the corresponding groups of electrodes to which they are coupled;

said selected signals being adapted to cause an electron beam in said tube to switch in said one direction from an initial position to a single position determined by the combination of said selected signals, there being a single position to which an electron beam is switched for each combination of said signals, the current flow from each single position having a representation in another code corresponding to the representation in the first code of the combination of signal elements which caused the electron beam to switch to the single position.

10. The circuit defined in claim 9 wherein said signal input coupling means are connected to selected spade electrodes and switching grid electrodes.

11. A binary decoder comprising a multi-position electron tube including a cathode and a plurality of groups of electrodes;

each of said groups of electrodes comprising a position at which an electron beam may form;

each of said groups including a target electrode adapted to receive an electron beam and provide an output signal therefrom, a spade electrode adapted to form and hold an electron beam on its associated target electrode, and a switching electrode adapted for switching an electron beam from one group of electrodes to the next;

means in operative relation with said tube providing crossed electric and magnetic fields therein by means of which an electron beam may be switched from one group of electrodes to the next in one direction;

means providing a multi-bit binary signal;

means coupling one bit of said signal to selected ones of said switching electrodes;

means coupling another bit of said signal to others of said switching electrodes;

means coupling still another bit to one of said spade electrodes;

said bits being adapted to be applied to said tube in different combinations; each of said combinations causing an electron beam to form in a different position in said tube;

said position providing an output signal which represents the decimal equivalent of the selected combination of binary bits.

12. A binary decoder comprising a multi-position electron tube including a cathode and a plurality of groups of electrodes;

each of said groups comprising a position at which an electron beam may form;

each of said groups including a target electrode adapted to receive an electron beam and provide an output signal therefrom, a spade electrode adapted to form and hold an electron beam on its associated target electrode, and a switching electrode adapted for switching an electron beam from one group of electrodes to the next;

alternate ones of said switching electrodes being connected together directly to form two sets of electrodes;

one of said switching electrodes being connected indirectly to one of said sets;

means providing a multi-bit binary signal;

means coupling one bit of said signal to one set of said switching electrodes;

means coupling another bit of said signal to the other set of said switching electrodes;

means coupling still another bit to one of said spade electrodes;

said bits being adapted to be applied to said tube in different combinations;

each of said combinations causing an electron beam to form in one position in said tube;

said position representing the decimal equivalent of the selected combination of binary bits.

13. A binary decoder comprising a multi-position electron tube including a cathode and a plurality of groups of electrodes;

each of said groups comprising a position at which an electron beam may form;

said positions being numbered arbitrarily zero, one, two, three, four, five, six . . . "$n$";

each of said groups of electrodes including a target electrode adapted to receive an electron beam and to provide an output signal therefrom, a spade electrode adapted to form and hold an electron beam on its associated target electrode, and a switching electrode adapted for switching an electron beam from one group of electrodes to the next;

all of said switching electrodes but one being connected in two sets with alternate electrodes being connected in each set;

a diode signal mixing gate comprising two diodes having their anodes connected together;

the cathode of one diode being connected to one set of switching electrodes;

the cathode of the other diode being connected to the other set of switching electrodes;

said one of said switching electrodes being connected to the anodes of said diodes;

means for providing a binary word comprising a plurality of signal bits;

means coupling one of said bits through one portion of said diode mixing gate to one set of switching electrodes;

means coupling another of said bits through said gate to the other set of switching electrodes;

and means coupling others of said bits to selected ones of said spade electrodes.

14. A binary decoder comprising a multi-position electron tube including a cathode and a plurality of groups of electrodes;

each of said groups comprising a position at which an electron beam may form;

said positions being numbered arbitrarily zero, one, two, three, four, five, six . . . "$n$";

each of said groups including a target electrode adapted to receive an electron beam and to provide an output signal therefrom, a spade electrode adapted to form and hold an electron beam on its associated target electrode, and a switching electrode adapted for switching an electron beam from one group of electrodes to the next;

the switching electrodes at the odd-numbered positions being connected together in one set;

the switching electrodes at the even-numbered positions except the four position being connected together in a second set;

a diode signal mixing gate comprising two diodes having their anodes connected together;

the cathode of one diode being connected to said one set of switching electrodes and the cathode of the other diode being connected to said other set of switching electrodes;

the switching electrode at the four position being connected to the anodes of said diodes;

means providing a multi-bit binary signal;

means coupling one bit of said signal to said one set of said switching electrodes;

means coupling another bit of said signal to said other set of switching electrodes;

means coupling still other bits to selected ones of said spade electrodes;

said bits being adapted to be applied to said electrodes in different combinations;

each of said combinations causing an electron beam to form in one position in said tube;

said position representing the decimal equivalent of the selected combination of binary bits.

15. The decoder defined in claim 14 wherein said selected ones of said spade electrodes are the spade electrodes at the second and fourth positions.

16. The decoder defined in claim 14 wherein said selected ones of said spade electrodes are the spade electrodes at the second and fourth positions and including a diode coupled between said spade at said second position and said set of switching electrodes at said odd-numbered positions.

References Cited in the file of this patent

UNITED STATES PATENTS 2,807,748 Lee ---------------------- Sept. 24, 1957